US005130597A

United States Patent [19]

Mariani

[11] Patent Number: 5,130,597

[45] Date of Patent: Jul. 14, 1992

[54] AMPLITUDE ERROR COMPENSATED SAW REFLECTIVE ARRAY CORRELATOR

[75] Inventor: Elio A. Mariani, Hamilton Square, N.J.

[73] Assignee: The United States of America as represented by the Secretary of the Army, Washington, D.C.

[21] Appl. No.: 689,682

[22] Filed: Apr. 19, 1991

[51] Int. Cl.[5] .................... H01L 41/08

[52] U.S. Cl. .................... 310/313 D; 333/153; 333/195

[58] Field of Search .................... 310/313 D; 333/153, 333/195

[56] References Cited

U.S. PATENT DOCUMENTS

| | | | |
|---|---|---|---|
| 3,978,437 | 8/1976 | Paige | 333/195 |
| 4,166,228 | 8/1979 | Solie | 333/155 |
| 4,319,154 | 3/1982 | Solie | 310/313 D |
| 4,618,841 | 10/1986 | Riha | 333/195 |
| 4,623,853 | 11/1986 | Watanabe et al. | 333/151 |
| 4,672,254 | 6/1987 | Dolat et al. | 310/313 R |
| 4,745,321 | 5/1988 | Raschke | 310/313 D |
| 4,773,138 | 9/1988 | Ballato et al. | 310/313 D |
| 4,801,836 | 1/1989 | Mariani | 310/313 D |
| 4,857,870 | 8/1989 | Gautier et al. | 333/195 |

*Primary Examiner*—Mark O. Budd

*Assistant Examiner*—Thomas M. Dougherty

*Attorney, Agent, or Firm*—Michael Zelenka; Robert A. Maikis

[57] ABSTRACT

An amplitude error compensated surface acoustic wave reflective array correlator is provided having an input interdigital transducer feeding a first slanted reflective array grating, a second slanted reflective array grating feeding an output transducer and a third, amplitude error compensation slanted reflective array grating feeding the output transducer. The third array grating receives only the leakage surface acoustic waves leaking past the second array grating from the first array grating and has a frequency and amplitude selective configuration which enables it to select those leakage surface acoustic wave signals which when added to the output of the second array grating by means of a multistrip coupler and fed to the output transducer provide an amplitude error compensated output RF signal. The frequency and amplitude selective configuration of the third array grating is obtained by forming the grating of discreet packets of reflectors, controlling the spatial location of the packets along the length of the array, the number and length of the reflectors in each packet and, if reflective grooves are employed, the depths of the grooves.

9 Claims, 2 Drawing Sheets

AMPLITUDE ERROR COMPENSATED SAW REFLECTIVE ARRAY CORRELATOR

GOVERNMENT INTEREST

The invention described herein may be manufactured, used, and licensed by or for the Government for governmental purposes without the payment to me of any royalties thereon.

FIELD OF INVENTION

This invention relates to surface acoustic wave (SAW) devices and more particularly to a SAW reflective array correlator wherein unwanted time sidelobes or amplitude errors in the output of the correlator are minimized or eliminated.

DESCRIPTION OF THE PRIOR ART

SAW devices essentially convert input RF electric signals into surface acoustic waves (SAWs) for the purpose of signal processing or for obtaining a time delay, for example, and then reconvert the processed or delayed SAWs back into output RF electric signals. These devices are extremely useful because the very low velocity of acoustic waves relative to the velocity of electromagnetic waves makes it possible to produce relatively long electric signal time delays in a device having a very small physical size.

SAW reflective array correlators or compressors (RACs) are often used for bandwidth dispersive applications, such as pulse compression and chirp signal processing, for example. The SAW RAC devices used in these applications play an important role in modern compressive microscan receivers and pulse compression radars where the presence of amplitude error or ripple in the RAC output contribute to time sidelobes which adversely affect receiver dynamic range and target resolution. Unfortunately, several factors, such as production imperfections in the fabrication of the SAW RACs, for example, cause the RACs to have the unwanted amplitude errors or ripple in their output and thus degrade their performance for the foregoing applications. At the present time, however, normal SAW RAC device operation does not employ any internal amplitude error compensation but only provides for phase error compensation by means of a thin metal phase plate or film which is patterned to compensation for the phase errors.

SUMMARY OF THE INVENTION

It is an object of this invention to provide a SAW RAC having internal amplitude error compensation means.

It is a further object of this invention to provide a SAW RAC having internal amplitude error compensation means which do not increase the insertion loss of the SAW RAC device.

It is a still further object of this invention to provide an amplitude error compensated SAW RAC which is relatively easy to manufacture with existing SAW RAC fabrication techniques.

Briefly, the amplitude error compensated SAW RAC of the invention comprises a piezoelectric crystal substrate having a pair of oppositely disposed ends and a planar surface between the ends. Input interdigital transducer means are disposed on the substrate surface adjacent one of the pair of substrate ends for propagating SAW signals along a first path on the substrate surface toward the other of the pair of substrate ends in response to an input RF signal applied to the transducer means. Output interdigital transducer means are disposed on the substrate surface adjacent the one substrate end for converting SAW signals travelling along a second path on the substrate surface from the other substrate end toward the one substrate end to an output RF signal. The output RF signal contains known amplitude errors at known frequencies. The second path is substantially parallel to the first path. First dispersive reflective array grating means are disposed along the first path for reflecting the SAW signals travelling along the first path along a plurality of frequency dispersed third paths on the substrate surface toward the second path. The third paths traverse the second path. Second dispersive reflective array grating means are disposed along the second path for reflecting the SAW signals travelling along the plurality of third paths along the second path toward the one substrate end. Third dispersive reflective array grating means having a frequency and amplitude selective configuration are disposed along a fourth path on the substrate surface for reflecting along the fourth path toward the one substrate end amplitude error compensation SAW signals selected from leakage SAW signals leaking through the second reflective array grating means along the plurality of third paths, the fourth path being substantially parallel to the second path. The amplitude error compensation SAW signals have amplitudes and frequencies which correct for the known amplitude errors at the known frequencies in the output RF signal when the amplitude error compensation SAW signals travelling along the fourth path are combined with SAW signals travelling along the second path and fed to the input of the output interdigital transducer means. Finally, means are provided on the substrate surface for combining the amplitude error compensation SAW signals travelling along the fourth path with the SAW signals travelling along the second path and feeding the resultant combined signals to the input of the output interdigital transducer means to produce an amplitude error compensated RF output signal from the output interdigital transducer means.

The nature of the invention and other objects and additional advantages thereof will be more readily understood by those skilled in the art after consideration of the following detailed description taken in conjunction with the accompanying drawings.

DESCRIPTION OF THE PREFERRED EMBODIMENT OF THE INVENTION

Figure 1:
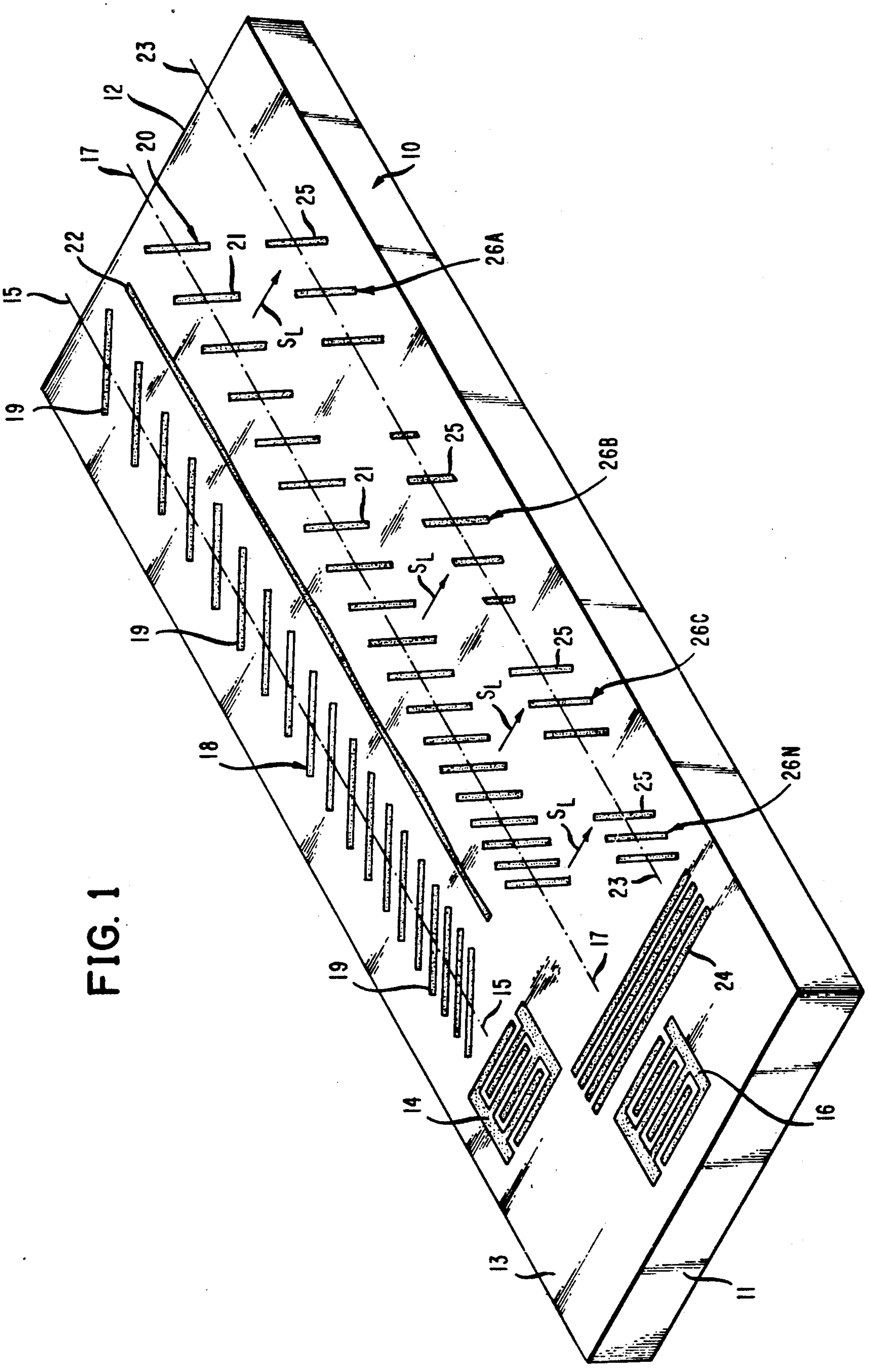
FIG. 1 is a schematic perspective view of the amplitude error compensated SAW RAC of the invention.

Referring now to FIG. 1 of the drawings, there is shown an amplitude error compensated SAW RAC constructed in accordance with the teachings of the present invention comprising a piezoelectric crystal substrate, indicated generally as 10, which has a pair of ends 11 and 12 and a planar surface 13. An input interdigital transducer 14 is disposed on the substrate surface 13 adjacent the substrate end 11 and propagates SAW signals along a first path indicated schematically by the dot-line 15 on the substrate surface toward the other end 12 of the substrate in response to an input RF signal applied to the transducer means. The width of the path 15 over which the SAW signals are transmitted is, of course, approximately the same width as the transducer 14. The transducer 14 may comprise a thin film of aluminum or other conductive metal which is deposited on the surface 13 of the substrate in accordance with well known techniques. The input RF signal voltage is applied between the two interleaved sets of fingers of the transducer and the input leads have been omitted from the drawing for clarity of illustration. An output interdigital transducer 16 is disposed on the substrate surface 13 adjacent the same substrate end 11 and serves to convert SAW signals travelling along a second path 17 from the other substrate end 12 toward the substrate end 11 to an output RF signal which usually contains amplitude errors at certain frequencies. These amplitude errors and the frequencies at which they occur may be ascertained or "known" from the RF signal output by means of amplitude vs. frequency tests which are well known in the art. The output transducer 16 is of the same construction as the input transducer 14 and may be fabricated in the same manner.

First dispersive reflective slanted array grating means, indicated generally as 18, are disposed along the first path 15 and serve to reflect the SAW signals travelling along the first path 15 along a plurality of frequency-dispersed third paths (not shown) on the substrate surface 13 toward the second path 17. The first dispersive reflective array grating means 18 comprises a plurality of reflectors 19 which are slanted approximately 45 degrees with respect to the propagation path axis 15 so that the SAW signals reflected from these reflectors travel along the plurality of third paths which are disposed approximately 90 degrees with respect to the axis of the first path 15 whereby the reflected SAW signals are directed toward a second dispersive reflective array grating means, indicated generally as 20, which is disposed along the second path 17. The reflected SAW signals travelling along the plurality of third paths from the first grating 18 are further reflected by individual reflectors 21 which form the second array grating 20 toward the output interdigital transducer 16 because the reflectors 21 of the second array grating are almost perpendicular with respect to the corresponding reflectors 19 in the first array grating 18. Both the first and the second reflective array grating means are dispersive gratings which means that the spacing between adjacent individual reflectors in each array grating varies as a function of the distance from the end 11 of the substrate to the end 12 of the substrate so that the plurality of third paths are frequency-dispersed. For example with the array configuration illustrated, the frequency of the SAW signals reflected along those third paths which are closest to the end 11 of the substrate would be higher than the frequency of the SAW signals reflected along those third paths which are closer to the other end 12 of the substrate, so that the frequency of the reflected SAW signal would decrease the closer the third path it is travelling on is to the other end 12 of the substrate. Both the first array grating and the second array grating should have the same periodicity, i.e., spacings between individual reflectors of the array.

The individual reflectors of the array gratings shown may be formed on the surface of the substrate 10 by means of thin-film deposits of aluminum or by means of etched shallow grooves in accordance with known techniques. A phase plate 22 which may also comprise an aluminum deposit is formed between the first array grating 18 and the second array grating 20 and is patterned in accordance with known techniques to compensate for phase errors appearing in the output RF signal from the output transducer 16. The phase plate 17, however, will not compensate for amplitude errors which appear in the output RF signal from the transducer 16. The fabrication and operation of SAW RACs is well known in the art and will not be described further herein except to note that the substrate 10 is usually made of quartz when the individual reflectors of each of the arrays 18 and 20 are made of metal reflecting strips and is made of a material such as lithium niobate when the individual reflectors of each array are formed by ion-etched grooves.

The SAW RAC of the invention also comprises amplitude error compensation means which are disposed along a fourth path 23 on the substrate surface and which provide amplitude error compensation SAW signals to a multistrip coupler 24. The coupler 24 also receives the SAW signals travelling along the second path 17. The error compensation means comprise third dispersive reflective array grating means 26 having a frequency and amplitude selective configuration formed by a plurality of discreet packets 26A, 26B, 26C --- 26N which are each composed of varying numbers of individual reflectors 25. The reflectors 25 in each of the packets 26A thru 26N should have the same periodicity and angular orientation as the reflectors 21 of the second array 20. The function of this third or auxiliary array 26 is to reflect along the fourth path 23 toward the multistrip coupler 24 amplitude error compensation SAW signals which are selected from leakage SAW signals $S_L$ which leak through the second array grating 20 and are normally lost and not utilized. The amplitude error compensation SAW signals which are reflected along the fourth path 23 by the auxiliary array 26 have amplitudes and frequencies which correct for the known amplitude errors at the known frequencies in the output RF signal when the amplitude error compensation SAW signals travelling along the fourth path 23 are combined with the normal SAW output signals travelling along the second path 17 and fed to the input of the output interdigital transducer means 16. The multistrip coupler 24 illustrated in FIG. 1 which is well known in the art, serves to combine both of these SAW signals and to feed the resultant combined SAW signals to the input of the output transducer 16.

The third or auxiliary dispersive reflective array grating 26 may be formed in the same manner as the first and second array gratings 18 and 20, i.e., by employing etched grooves or metallic strips, and is given a frequency and amplitude selective configuration which enables it to reflect the amplitude error compensation SAW signals along the fourth path 23 by selecting those frequencies and amplitudes of the leakage SAW signals $S_L$ which are needed for the compensation. The discreet packets 26A thru 26N of reflectors in the auxiliary array grating are located at those spatial positions along the length of path 23 which correspond to the frequencies at which an amplitude error compensation SAW signal is needed to correct an amplitude error appearing in the output RF signal which arises from that particular frequency or frequencies. Accordingly, the number of reflectors in each of the plurality of discreet jackets of reflectors 26A thru 26N may be selectively varied to control both the amplitudes and frequencies of the fourth path amplitude error compensation SAW signals which are added to the normal RAC output SAW signals travelling along the second path 17 by the multistrip coupler 24. In a similar fashion, the shape of the "envelope" of each of the plurality of discreet packets of reflectors 26A through 26N may be selectively varied to effect a finer or "vernier" adjustment of amplitudes and frequencies of the amplitude error compensation SAW signals. For example, reflector packet 26B in the auxiliary array 26 has an envelope configuration which is formed by varying the lengths of the individual reflectors 25 forming that particular packet. When the reflectors forming each of the reflector packets 26A thru 26N are formed by etched grooves, the depths of the grooves may also be controlled in addition to the length of the grooves.

When an amplitude error compensated SAW RAC device is fabricated in accordance with the invention, a preliminary amplitude versus frequency measurement test is made with the third or auxiliary array grating 26 either disabled or nonexistent, depending on the method used to fabricate the auxiliary reflectors in the third array grating. When the reflectors 25 in the third array grating are formed by metallic, thin-film reflecting strips, a linearly dispersive array of these strips would be placed along the entire length of the third path 23 of the substrate at the time when the first and second array gratings 18 and 20 are formed. The third array at this time would have exactly the same configuration as the second array and would not be divided into the discreet groups or packets of reflectors 26A thru 26N. The preliminary amplitude versus frequency test would then be made and the metallic reflectors in the auxiliary or third array 26 would be selectively removed using photolithographic or laser-etching means leaving behind only the desired packets and configurations of packets needed to effect the amplitude error compensation. If the individual reflectors 25 of the auxiliary or third array grating 26 are formed by shallow grooves in the substrate surface, the preliminary amplitude versus frequency test would be performed before the auxiliary or third array grating 26 is formed. With the known test results, the grooves could then be fabricated in the exact spatial positions and density and lengths and grouped into the number of packets required using standard ion-milling or plasma etching techniques.

Figure 2:
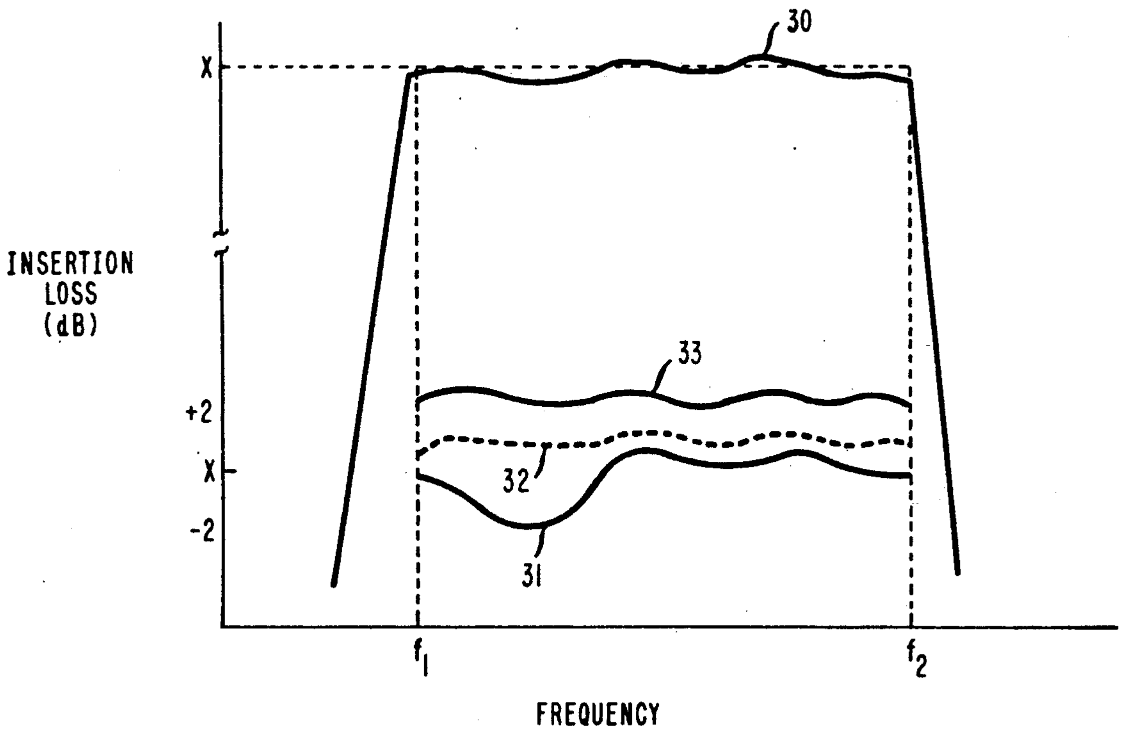
FIG. 2 is a graphical representation showing the insertion loss as a function of frequency for both amplitude error compensated SAW RACs and uncompensated SAW RACs.

FIG. 2 of the drawings is a graphical representation which illustrates a very important advantage of the present invention, namely, that the use of an auxiliary or third reflective array grating to compensate for amplitude errors which utilizes only the leakage SAW signals $S_1$ in a SAW RAC device does not increase the overall insertion loss of the SAW RAC device. In FIG. 2, insertion loss is shown as a function of frequency over the operating frequency bandwidth of the device and the curve 30 shows the response of a SAW RAC which is not amplitude error compensated. Curve 31 shows the same response of an uncompensated SAW RAC on a magnified scale wherein the ripples and variations in amplitude are more pronounced over the effective frequency bandwidth $f_1$-$f_2$ of the device. Curve 32 which is a dashed line curve, shows the response of a SAW RAC device which is amplitude error compensated in accordance with the teachings of the present invention and shows that the insertion loss is the same as that of an uncompensated SAW RAC. Curve 33 shows the response of a SAW RAC device which does not employ amplitude compensation in accordance with the teachings of the present invention and which might place the auxillary or third array grating between the first and second array gratings of the SAW RAC, i.e., adjacent the phase plate location. In this location, the insertion loss would be substantially increased over an uncompensated device.

It is believed apparent that many changes could be made in the construction and described uses of the foregoing amplitude error compensated SAW RAC and many seemingly different embodiments of the invention could be constructed without departing from the scope thereof. Accordingly, it is intended that all matter contained in the above description or shown in the accompanying drawings shall be interpreted as illustrative and not in a limiting sense.

What is claimed is:

1. An amplitude error compensated SAW reflective array correlator comprising:

a piezoelectric crystal substrate having a pair of oppositely disposed ends and a planar surface between said ends;

input interdigital transducer means disposed on said substrate surface adjacent one of said pair of substrate ends for propagating SAW signals along a first path on said substrate surface toward the other of said pair of substrate ends in response to an input RF signal applied to said transducer means;

output interdigital transducer means disposed on said substrate surface adjacent said one substrate end for converting SAW signals travelling along a second path on said substrate surface from said other substrate end toward said one substrate end to an output RF signal, said output RF signal containing known amplitude errors at known frequencies, said second path being substantially parallel to said first path;

first dispersive reflective array grating means disposed along said first path for reflecting the SAW signals travelling along said first path along a plurality of frequency dispersed third paths on said substrate surface toward said second path, said third paths traversing said second path;

second dispersive reflective array grating means disposed along said second path for reflecting the SAW signals travelling along said plurality of third paths along said second path toward said one substrate end;

third dispersive reflective array grating means having a frequency and amplitude selective configuration disposed along a fourth path on said substrate surface for reflecting along said fourth path toward said one substrate end amplitude error compensation SAW signals selected from leakage SAW signals leaking through said second reflective array grating means along said third paths, said fourth path being substantially parallel to said second path, said amplitude error compensation SAW signals having amplitudes and frequencies which correct for said known amplitude errors at said known frequencies in said output RF signal when said amplitude error compensation SAW signals travelling along said fourth path are combined with said SAW signals travelling along said second path and fed to the input of said output interdigital transducer means; and means for combining said amplitude error compensation SAW signals travelling along said fourth path with said SAW signals traveling along said second path and feeding the resultant combined SAW signals to the input of said output interdigital transducer means to produce an amplitude error compensated RF output signal from said output interdigital transducer means.

2. An amplitude error compensated SAW reflective array correlator as claimed in claim 1 wherein each of said first, second and third reflective array grating means comprises a linearly dispersive reflective array grating.

3. An amplitude error compensated SAW reflective array correlator as claimed in claim 2 wherein said first, second and third dispersive reflective array gratings have the same periodicity and wherein said frequency and amplitude selective configuration of said third dispersive reflective array grating comprises a plurality of discrete packets of reflectors disposed along said fourth path.

4. An amplitude error compensated SAW reflective array correlator as claimed in claim 3 wherein said means for combining said second path SAW signals with said fourth path amplitude error compensation SAW signals and feeding said resultant combined SAW signals to said output interdigital transducer means comprises a multistrip coupler.

5. An amplitude error compensated SAW reflective array correlator as claimed in claim 3 wherein each of the reflectors in said plurality of discrete packets of reflectors comprises a metallic strip reflector disposed on said surface of said substrate.

6. An amplitude error compensated SAW reflective array correlator as claimed in claim 3 wherein each of the reflectors in said plurality of discrete packets of reflectors comprises a groove formed in said surface of said substrate.

7. An amplitude error compensated SAW reflective array correlator as claimed in claim 3 wherein the number of reflectors in each of said plurality of discrete packets of reflectors is selectively varied to control the amplitudes and frequencies of said fourth path amplitude error compensation SAW signals.

8. An amplitude error compensated SAW reflective array correlator as claimed in claim 3 wherein the shape of the envelope of at least one of said plurality of discrete packets of reflectors is selectively varied by selectively controlling the lengths of the reflectors in each of said packets to control the amplitudes and frequencies of said fourth path amplitude error compensation SAW signals.

9. An amplitude error compensated SAW reflective array correlator as claimed in claim 6 wherein the depths of the grooves in each of said plurality of discrete packets of reflectors is selectively varied to control the amplitudes and frequencies of said fourth path amplitude error compensation SAW signals.

* * * * *